US009188623B2

(12) United States Patent
Fokkelman et al.

(10) Patent No.: US 9,188,623 B2
(45) Date of Patent: Nov. 17, 2015

(54) METHOD AND APPARATUS FOR DETERMINING AT LEAST ONE OPERATING PARAMETER OF A THERMOELECTRIC SYSTEM IN A VEHICLE

(75) Inventors: Joris Fokkelman, Tegernheim (DE); Karsten Hofmann, Pettendorf (DE); Martin Böld, Regensburg (DE); Christoph Weigand, Regensburg (DE)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 283 days.

(21) Appl. No.: 13/814,078

(22) PCT Filed: Jul. 29, 2011

(86) PCT No.: PCT/EP2011/063149
§ 371 (c)(1),
(2), (4) Date: Apr. 15, 2013

(87) PCT Pub. No.: WO2012/016933
PCT Pub. Date: Feb. 9, 2012

(65) Prior Publication Data
US 2013/0200919 A1 Aug. 8, 2013

(30) Foreign Application Priority Data
Aug. 5, 2010 (DE) .......................... 10 2010 033 534

(51) Int. Cl.
*G01R 31/26* (2014.01)
*H02S 10/30* (2014.01)
*F01N 5/02* (2006.01)

(52) U.S. Cl.
CPC ................ *G01R 31/26* (2013.01); *H02S 10/30* (2014.12); *F01N 5/025* (2013.01); *F23M 2900/13003* (2013.01); *F23M 2900/13004* (2013.01); *Y02T 10/166* (2013.01)

(58) Field of Classification Search
CPC .......... F23M 2900/13003; F23M 2900/13004; Y02T 10/166; F01N 5/025; G01R 31/26
USPC ............... 136/200, 205; 320/101; 324/762.01
See application file for complete search history.

(56) References Cited

U.S. PATENT DOCUMENTS

| 2003/0066290 A1 | 4/2003 | Murata et al. .................... 60/698 |
| 2003/0140961 A1 | 7/2003 | Damson et al. ................ 136/244 |

(Continued)

FOREIGN PATENT DOCUMENTS

| DE | 10330574 A1 | 6/2004 | ................ F03G 6/00 |
| DE | 102008035826 A1 | 1/2010 | ................ F01N 5/02 |

(Continued)

OTHER PUBLICATIONS

German Office Action, Application No. 10 2010 033 534.7, 8 pages, Jun. 7, 2011.

(Continued)

*Primary Examiner* — Melissa Koval
*Assistant Examiner* — Daniel Miller
(74) *Attorney, Agent, or Firm* — Slayden Grubert Beard PLLC

(57) ABSTRACT

A method is provided for determining at least one operating parameter of a thermoelectric system in a vehicle, wherein the thermoelectric system comprises an energy conversion device having at least one photovoltaic element for converting thermal radiation, which is emitted by a heat source of the vehicle, into electrical energy. The method includes measuring an electrical power of the photovoltaic device, and determining an operating parameter of the thermoelectric system based on the measured electrical power of the photovoltaic device.

20 Claims, 2 Drawing Sheets

(56) References Cited

U.S. PATENT DOCUMENTS

| | | | |
|---|---|---|---|
| 2008/0098972 A1 * | 5/2008 | Elwart | 123/142.5 E |
| 2010/0183993 A1 | 7/2010 | Mcalister | 431/254 |

FOREIGN PATENT DOCUMENTS

| | | | | |
|---|---|---|---|---|
| DE | 102008042927 A1 | 4/2010 | | B60K 13/04 |
| EP | 0391595 A1 | 10/1990 | | B64D 41/00 |
| EP | 2056180 A1 | 5/2009 | | B60L 11/18 |
| JP | 2007014084 A * | 1/2007 | | |
| WO | 02/053408 A1 | 7/2002 | | B60J 3/02 |
| WO | 2006/024256 A1 | 3/2006 | | H05B 37/0272 |
| WO | 2012/016933 A2 | 2/2012 | | H01L 31/04 |

OTHER PUBLICATIONS

International Search Report and Written Opinion, Application No. PCT/EP2011/063149, 21 pages, Nov. 22, 2012.

* cited by examiner

Fig. 2

| Measured power $P_{ist}$ | Expected power $P_{ref}$ | Diagnosis |
|---|---|---|
| $P_{ist} = 0$ | $P_{ref}$ | - no functional capability of the photovolt. device as a whole<br>- if $P_{ist}$ in previous driving cycle has been equal P<br>→ interruption in the circuit |
| $0 < P_{ist} < P_{ref}$ | $P_{ref}$ | if the actual temperature $T_{ist}$ is known:<br>- no functional capability present in some of the photovoltaic elements<br>if the actual temperature $T_{ist}$ is unknown:<br>- actual temperature deviates from the expected temperature, or<br>- no functional capability present in some of the photovoltaic elements |
| $0 < P_{ist} < P_{ref}$ and $P_{ist}$ slowly decreasing | $P_{ref}$ | degradation of the efficiency of the photovolt. elements due to:<br>- soiling of the surface, or<br>- functional capability reduced by ageing |
| $P_{ref} \rightarrow 0 \rightarrow P_{ref}$ etc. | $P_{ref}$ | loose contact present |
| $P_{ist} > P_{ref}$ | $P_{ref}$ | overheating of the heat source |

METHOD AND APPARATUS FOR DETERMINING AT LEAST ONE OPERATING PARAMETER OF A THERMOELECTRIC SYSTEM IN A VEHICLE

CROSS-REFERENCE TO RELATED APPLICATIONS

This application is a U.S. National Stage Application of International Application No. PCT/EP2011/063149 filed Jul. 29, 2011, which designates the United States of America, and claims priority to DE Application No. 10 2010 033 534.7 filed Aug. 5, 2010, the contents of which are hereby incorporated by reference in their entirety.

TECHNICAL FIELD

The disclosure relates to a thermoelectric system for a vehicle, in particular for a motor vehicle comprising an internal combustion engine. In addition, the disclosure relates to a method for determining an operating state of the thermoelectric system.

BACKGROUND

The increasing hybridization of vehicles makes it necessary to make available electrical energy in the vehicle to a greater degree than is necessary in a conventional motor vehicle for operating electrical systems. Since insufficient electrical energy can be made available with contemporary battery technology, it is necessary to provide the vehicle with devices for acquiring and recovering electrical energy. For this purpose, inter alia, methods for recovering energy such as, for example, the recuperation of braking energy or the thermoelectric conversion of energy from waste heat which is produced in the combustion process are known. The thermoelectric conversion of energy takes place, inter alia, by utilizing the photoelectric effect, wherein the thermal radiation which is emitted by a hot component is converted directly into an electric voltage by means of photovoltaic cells. The photovoltaic cells which are typically formed from semiconductor materials are arranged here as close as possible to the heat source in order to obtain the highest possible energy yield. In this environment, these sensitive components are subjected to conditions which can have an adverse effect on the functional capability and/or efficiency of the photovoltaic elements. It is therefore possible, for example, for heat and various chemical substances to contribute to an accelerated ageing process of the photovoltaic elements which are typically formed from semiconductor materials. Furthermore, soiling of the photovoltaic elements can lead to a loss of efficiency due to shadowing effects. In addition, the further components of the thermoelectric system such as, for example, the cabling or the plug-type connections of the photo cells may also lead to a reduction in the efficiency level of the system due to ageing or owing to damage.

In order to detect such disruption of the thermoelectric system in good time and avoid losses during the recovery of energy by means of suitable countermeasures, it is appropriate to monitor the operating state of the thermoelectric system.

SUMMARY

One embodiment provides a method for determining at least one operating parameter of a thermoelectric system in a vehicle, wherein the thermoelectric system comprises an energy conversion device having at least one photovoltaic element for converting thermal radiation, emitted by a heat source of the vehicle, into electrical energy, the method comprising the steps: measuring an electrical power of the photovoltaic device, and determining the operating parameter based on the measured electrical power of the photovoltaic device.

In a further embodiment, the measured electrical power is compared with an expected electrical power of the energy conversion device, and wherein the operating parameter is determined from the comparison of the measured electrical power with the expected electrical power.

In a further embodiment, the expected electrical power is calculated from a temperature of the heat source which is measured by means of a temperature sensor or obtained by means of a characteristic diagram, or said electrical power is obtained by means of a characteristic diagram.

In a further embodiment, the operating parameter is determined within the scope of a diagnosis of the thermoelectric system, during which a functional state of the thermoelectric system is evaluated by means of the measured electrical power.

In a further embodiment, the evaluation comprises at least one of the following statements: if the measured electrical power is equal to zero, there is no functional capability of the energy conversion device present; if the currently measured electrical power is equal to zero and at the same time an electrical power measured in the previous driving cycle corresponds to an expected electrical power, an interruption in the circuit is present; if the actual temperature of the heat source is known and the measured electrical power of the energy conversion device which comprises a plurality of photovoltaic elements is greater than zero and less than the expected electrical power, there is no functional capability present in some of the photovoltaic elements; if the actual temperature of the heat source is unknown and the measured electrical power of the energy conversion device which comprises a plurality of photovoltaic elements is greater than zero and less than the expected power, either the actual temperature deviates from the expected temperature, or there is no functional capability present in some of the photovoltaic elements; if the measured electrical power is greater than zero and less than the expected power and the electrical power decreases over a relatively long time period, degradation of the efficiency of the energy conversion device has occurred due to soiling and/or ageing of the photovoltaic elements; if the measured electrical power drops to zero, there is no interruption present in the circuit; if the measured electrical power swings to and fro between zero and the expected electrical power, there is a loose contact present; if the measured electrical power is greater than the expected electrical power, overheating of the heat source is occurring.

In a further embodiment, a current temperature of the heat source is calculated by means of the measured electrical power.

In a further embodiment, the calculated temperature is compared with an expected temperature of the heat source, and the operating parameter is determined by means of the result of this comparison.

In a further embodiment, the efficiency level of the photoelectric element is determined as an operating parameter, a temperature of the heat source is calculated by means of the measured electrical power, and the efficiency level is calculated as a quotient of the calculated temperature and an expected temperature of the heat source which is measured by means of a temperature sensor or determined by means of a characteristic diagram.

In a further embodiment, the current power is determined by measuring the voltage and/or the current of the energy conversion device.

In a further embodiment, the current temperature of the heat source is determined as an operating parameter.

Another embodiment provides an apparatus for determining at least one operating parameter of a thermoelectric system in a vehicle, wherein the thermoelectric system comprises an energy conversion device having at least one photovoltaic element for converting thermal radiation, emitted by a heat source of the vehicle, into electrical energy, and wherein the apparatus is designed to measure an electrical power of the photovoltaic element and to determine the operating parameter based on the measured electrical power of the photovoltaic element.

BRIEF DESCRIPTION OF THE DRAWINGS

Exemplary embodiments will be explained in more detail below based on the schematic drawings, wherein:

FIG. 2 shows a tabular illustration of the diagnosis of the thermoelectric system and of its components.

DETAILED DESCRIPTION

Figure 1:
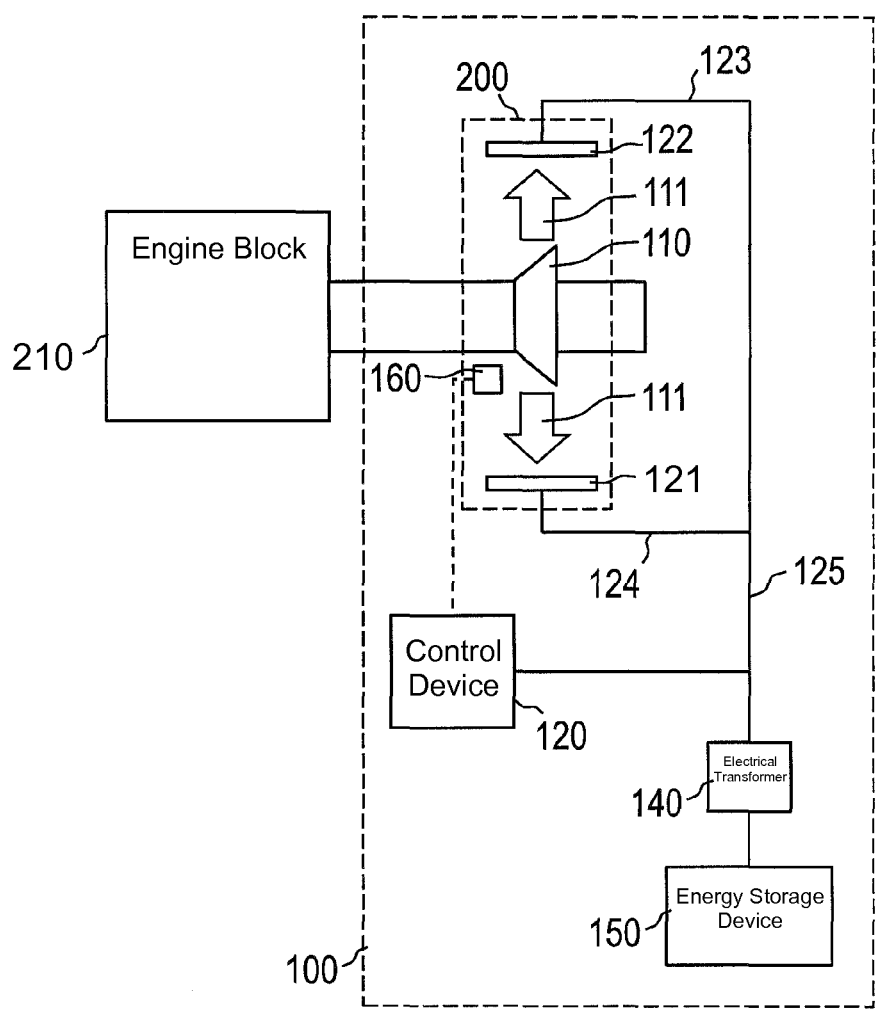
FIG. 1 shows a schematic illustration of the thermoelectric system with an energy conversion device comprising two separate elements.

Embodiments of the present disclosure provide methods and apparatuses for monitoring important operating parameters of a thermoelectric system.

According to some embodiments, a method for determining at least one operating parameter of a thermoelectric system in a vehicle is provided, wherein the thermoelectric system comprises an energy conversion device having at least one photovoltaic element for converting thermal radiation, emitted by a heat source of the vehicle, into electrical energy. The method comprises here measuring an electrical power of the photovoltaic device, and determining the operating parameter based on the measured electrical power of the photovoltaic device. The power monitoring provided here makes it possible to arrive at conclusions about various operating parameters of the thermoelectric system in a particularly easy way.

In one embodiment there is provision that the measured electrical power is compared with an expected electrical power of the energy conversion device, wherein the operating parameter is determined from the comparison of the measured electrical power with the expected electrical power. By comparing the measured power with the expected power, disruption to the system can easily be detected. A further advantageous embodiment provides that the expected electrical power is calculated at a temperature of the heat source which is measured by means of a temperature sensor or obtained by means of a characteristic diagram. Determining the expected temperature by means of a measured temperature provides a high level of accuracy. In contrast, using a characteristic diagram to determine the temperature permits the expected electrical power to be estimated without a corresponding temperature measurement.

A further embodiment provides that the operating parameter is determined within the scope of a diagnosis in which a functional state of the thermoelectric system is evaluated by means of the measured electrical power. Precise statements about the functional state of the system as a whole or about the functional state of its individual components are possible using such a diagnostic system. In particular, in this way, disruption to the system can be detected early, as a result of which selected measures for improving or maintaining the efficiency level of the system become possible in turn.

According to one further embodiment, the functional incapability of the energy conversion device is diagnosed if the measured electrical power is equal to zero. This permits very simple diagnosis of the entire system.

In addition there is provision that an interruption in the circuit is diagnosed if the currently measured power is equal to zero, but within the previous driving cycle this power corresponded to an expected electrical power. As a result, interruptions in the current caused by a cable break or the like within the system can very easily be detected.

In addition there is provision that functional incapability of a number of photovoltaic elements is diagnosed if, given knowledge of the actual temperature of the heat source, the measured electrical power of the energy conversion device which comprises a plurality of photovoltaic elements is greater than zero and less than the expected electrical power of the conversion device. This permits functional disruption in some of the photovoltaic elements to be detected.

In addition there is provision that either a deviation of the actual temperature from the expected temperature has occurred or some of the photovoltaic elements are functionally incapable if, when the actual temperature of the heat source is unknown, the measured electrical power of the energy conversion device which comprises a plurality of photovoltaic elements is greater than zero and less than the expected power. As a result, on the one hand, faults can be detected in the determination of the expected temperature. In addition, this makes it possible, even when the actual temperature is unknown, to detect that some of the photovoltaic elements are functionally incapable.

In addition there is provision that degradation of the efficiency level of the energy conversion device due to soiling and/or due to ageing of the photovoltaic elements is diagnosed if the measured electrical power is greater than zero and less than the expected power and this power decreases over a relatively long time period. As a result, countermeasures can be initiated in good time in order to maintain the efficiency level by cleaning or replacing the respective photovoltaic elements.

In a further embodiment there is provision that an interruption in the circuit is diagnosed if the measured electrical power suddenly drops to zero. This diagnosis can be used to initiate countermeasures in good time in order to ensure the highest possible efficiency level of the system.

In addition there is provision that a loose contact is diagnosed if the measured electrical power swings to and fro between zero and the expected electrical power. This diagnosis also makes it possible to initiate countermeasures in good time in order to ensure the highest possible efficiency level.

In addition there is provision that overheating of the heat source is diagnosed if the measured electrical power is greater than the expected electrical power. As a result it is possible to draw conclusions about a malfunction of the internal combustion engine even without corresponding measurement of the temperature of the heat source or when one of the temperature sensors fails. By means of selectively initiated measures it is therefore possible to avoid damage to the internal combustion engine of the motor vehicle and/or to/the thermoelectric system itself.

According to a further embodiment there is provision that the current temperature of the heat source is calculated by means of the measured electrical power levels. As a result it becomes possible to dispense with a local temperature measurement, which entails a cost reduction owing to the saving gained by the elimination of a temperature sensor.

In a further embodiment there is provision that the calculated temperature is compared with an expected temperature of the heat source, and the operating parameter is determined by means of the result of this comparison. This provides the possibility to implement the effective cross-sectional area or the diagnosis of the thermoelectric system at the level of the temperature.

According to a further embodiment, there is provision that the efficiency level of the photoelectric element is determined as an operating parameter, wherein a temperature of the heat source is calculated by means of the measured electrical power. The efficiency level is then calculated as a quotient of the calculated temperature and the expected temperature of the heat source, which is measured by means of a temperature sensor or determined by means of a characteristic diagram. This constitutes an alternative way of calculating the efficiency level.

According to a further embodiment there is provision that the current power is determined by measuring the voltage and/or the current of the energy conversion device. As a result, the power of the energy conversion device can be determined particularly easily.

According to a further embodiment there is provision that the current temperature of the heat source is determined as an operating parameter. As a result, a corresponding temperature sensor can be dispensed with, which in turn results in lower manufacturing costs.

FIG. 1 shows a thermoelectric system 100 for converting thermal energy emitted by a heat source of a vehicle into electrical energy. Basically any component of the vehicle which reaches a sufficiently high temperature during operation to ensure effective recovery of energy by means of photovoltaic elements is possible as a heat source 110. In the case of an internal combustion engine, these components are usually the engine block 210 itself or certain areas of the engine block thereof and the exhaust system and/or particularly hot sections of the exhaust system such as, for example, the manifold or catalytic converter. FIG. 1 illustrates schematically such a component 110 of automotive system 210, which emits energy in the form of thermal radiation 111. The thermoelectric system 100 comprises an energy conversion device 200 which, in the present case, has two separate photovoltaic elements 121, 122. The photovoltaic elements 121, 122 which are generally embodied as specific photovoltaic cells which are optimized for the IR range are suitably arranged in the vicinity of the heat source 110, with the result that the thermal radiation 111 emitted by the heat source 110 can be converted into electrical energy by the photovoltaic elements 121, 122. The photo cells 121, 122 are connected via cabling 123, 124, 125 to an energy storage device 150 for buffering the electrical energy. Typically an electrical transformer 140 is intermediately connected between the energy conversion device 200 and the energy storage device 150, in order to convert the voltage supplied by the energy conversion device 200 into the voltage necessary for the energy storage device 150 which is generally formed as a battery/accumulator cell.

The thermoelectric system 100 also comprises a control or monitoring device 120 which is used to control and/or monitor the operation of the energy conversion system 200. The control device 120 can be connected here to various components of the thermoelectric system 100 via corresponding lines. In the present example, the control device 120 is only connected to the line 125 for reasons of clarity.

This is intended to indicate that the control device 120 carries out a measurement of the electrical power $P_{act}$ which is currently being made available by the energy conversion device 200. As is also shown in FIG. 1, a temperature sensor 160 is arranged in the direct vicinity of the heat source 110. The temperature sensor 160 can be directly connected to the control device 120 via a corresponding electrical line (shown here by dashed lines) in this context. Alternatively, the control device 120 can also receive information about the temperature of the heat source 110 from another device of the vehicle.

The control device 120 may be designed to determine at least one operating parameter of the thermoelectric system 100. This may be done by measuring the current electrical power $P_{act}$ of the energy conversion device 200. The electrical power $P_{act}$ which may be detected by measuring the current and/or voltage at the input of the electric converter 140 can be used in the control device 120 to calculate the current temperature of the heat source 110. According to the Stefan-Boltzmann Law, which applies to black radiators, the following applies to the radiation power P[W] at a temperature T[K]:

$$P = \sigma \times A \times T^4$$

with the Stefan-Boltzmann constant $\sigma = 5.67 \times 10^{-8}$ WM$^{-2}$k$^{-4}$ and A[M$^2$] the surface of the body. According to this equation, a square centimeter of a hot surface at 500° C. emits approximately 2 watts per cm$^2$ power with maximum intensity at a wavelength of 5 μm. Assuming an efficiency of a photovoltaic cell of 7 to 15 percent, a measured power of the energy conversion device of approximately 0.2 watts per cm$^2$ occurs. If all the known factors of the energy conversation device 200 are known, for example the size of the photovoltaic cells 121, 122 and the distance and arrangement thereof with respect to the heat source 110, the power losses of the connecting lines 123, 124, 125 etc., it is possible to use the measured power $P_{act}$ of the energy conversion device 200 to make a statement about the radiation power of the heat source 110. Based on the radiation power determined it is finally possible to determine the temperature $T_{act}$ of the radiation source 110 by converting the Stefan-Boltzmann equation. By using this method it is also possible to obtain the temperature of certain parts in the vehicle even without a direct temperature measurement. The disclosed concept can therefore be used as a sensor set.

The efficiency level of the thermoelectric system 100 forms a further interesting operating parameter. Said efficiency level can be determined, for example, by means of the comparison, to be more precise by forming a quotient, between the measured power $P_{act}$ and an expected electrical power $P_{ref}$. The expected electrical power $P_{ref}$ which serves as a reference can for this purpose also be determined by means of the Stefan-Boltzmann Law from a known temperature $T_{act}$ of the radiation source. For this purpose, the radiation power P of the heat source 110 is firstly determined by means of this equation, and this value subsequently determined by multiplication by a factor which is known from the application of the system 100 and which takes into account the losses of the distance between the heat source 110 and the converter 140. The temperature $T_{act}$ can be determined here by means of a measurement and by means of characteristic diagrams if the respective engine operating point is known.

However, the efficiency level can also be determined by means of a comparison of a determined temperature with an expected temperature which is present as a reference.

The functional state of the thermoelectric system 100 or its components can also be determined as operating parameters. For this purpose, suitable diagnostic steps can be implemented in the control device 120. The diagnosis may be carried out by means of a comparison of the currently determined electrical power $P_{act}$ with a reference value $P_{ref}$.

In this context, an electrical power $P_{ref}$ which is expected at the respective measuring point can be used as the reference value. Said electrical power Pref may be calculated from the currently determined temperature $T_{act}$, using, for example, the Stefan-Boltzmann equation. Depending on the application, various functional states can be evaluated during the diagnosis. FIG. 2 shows for example a tabular compilation of suitable statements and/or evaluations for such a diagnosis.

Accordingly, the entire energy conversion device 200 does not function if zero is measured as the electrical power $P_{act}$. However, if the measured power $P_{act}$ measured in the previous driving cycle corresponded to an expected electrical power $P_{ref}$, it is assumed that there is a break in the circuit.

If the actual temperature $T_{act}$ of the heat source is known, it is, on the other hand, possible to detect defects in individual photocells 122 if the measured electrical power of the energy conversion device is 200 between zero and the expected electrical power $P_{ref}$. If the actual temperature $T_{act}$ of the heat source is, on the other hand, known, it is either assumed that there is a deviation of the actual temperature $T_{act}$ from the expected temperature $T_{ref}$ or a defect in individual photocells 122.

If an electrical power $P_{act}$ is measured which is between zero and the expected power $P_{ref}$ and if, in addition, it can be detected by a comparison of the currently measured power value and previously measured values, a creeping power loss is occurring, with the result that both soiling of the photocells 122 and a power reduction due to ageing effects are assumed to be present.

On the other hand, an interruption in the circuit can be diagnosed in the case of a sudden drop of the measured electrical power $P_{act}$ to zero. However, if the measured value is between the expected power $P_{ref}$ and zero, a loose contact is present in the circuit.

Finally, it can be assumed that overheating of the heat source is occurring if a value greater than the expected electrical power $P_{ref}$ is measured as an electrical power $P_{act}$.

The embodiments disclosed in the present description in relation to the figures are merely exemplary embodiments of the invention. In this context, depending on the application for the implementation of the invention all the features disclosed in this context may be relevant either individually or else in combination with one another.

What is claimed is:

1. A method for determining an operating parameter of a thermoelectric system in a vehicle, the thermoelectric system including an energy conversion device having at least one photovoltaic element for converting thermal radiation, emitted by a heat source of the vehicle, into electrical power, the method comprising:
measuring the electrical power converted by the photovoltaic element,
calculating the temperature of the source of the thermal radiation based on the measured electrical power converted by the photoyoltaic element; and
determining the operating parameter based on the measured electrical power converted by the photovoltaic element and the calculated temperature.

2. The method of claim 1, comprising:
comparing the measured electrical power with an expected electrical power of the energy conversion device, and
determining the operating parameter based on the comparison of the measured electrical power with the expected electrical power.

3. The method of claim 2, comprising calculating the expected electrical power from a temperature of the heat source measured by means of a temperature sensor or obtained by means of a characteristic diagram.

4. The method of claim 2, comprising determining the operating parameter within the scope of a diagnosis of the thermoelectric system, during which a functional state of the thermoelectric system is evaluated based on the measured electrical power.

5. The method of claim 4, wherein the evaluation comprises performing at least one of the following diagnoses:
when the measured electrical power is equal to zero, there is no functional capability of the energy conversion device present;
when the currently measured electrical power is equal to zero and at the same time an electrical power measured in a previous driving cycle corresponds to an expected electrical power, an interruption in a circuit is present;
when an actual temperature of the heat source is known and the measured electrical power of the energy conversion device which comprises a plurality of photovoltaic elements is greater than zero and less than the expected electrical power, there is no functional capability present in some of the photovoltaic elements;
when an actual temperature of the heat source is unknown and the measured electrical power of the energy conversion device which comprises a plurality of photovoltaic elements is greater than zero and less than the expected power, either the actual temperature deviates from the expected temperature, or there is no functional capability present in some of the photovoltaic elements;
when the measured electrical power is greater than zero and less than the expected power and the electrical power decreases gradually over, time degradation of the efficiency of the energy conversion device has occurred due to soiling and/or ageing of the photovoltaic elements;
when the measured electrical power drops to zero, there is no interruption present in the circuit;
when the measured electrical power swings to and fro between zero and the expected electrical power, there is a loose contact present; and
when the measured electrical power is greater than the expected electrical power, overheating of the heat source is occurring.

6. The method of claim 1, comprising calculating a current temperature of the heat source based on the measured electrical power.

7. The method of claim 6, comprising:
comparing the calculated temperature with an expected temperature of the heat source, and
determining the operating parameter based on the result of this comparison.

8. The method of claim 1, wherein the operating parameter is an efficiency level of the photovoltaic element, and wherein the method comprises:
calculating a temperature of the heat source based on the measured electrical power, and
calculating the efficiency level as a quotient of the calculated temperature and an expected temperature of the heat source measured by a temperature sensor or determined from a characteristic diagram.

9. The method of claim 1, comprising measuring the electrical power converted by the photovoltaic element by measuring at least one of the voltage and the current of the energy conversion device.

10. The method of claim 1, wherein the operating parameter is a current temperature of the heat source.

11. An apparatus for determining an operating parameter of a thermoelectric system in a vehicle, the apparatus comprising:
an energy conversion device having at least one photovoltaic element for converting thermal radiation, emitted by a heat source of the vehicle, into electrical power,
a control device configured for measuring the electrical power converted by the photovoltaic element of the energy conversion device and further configured for calculating the temperature of the source of the thermal radiation based on the measured electrical power converted by the photovoltaic element, and further configured for determining the operating parameter based on the measured electrical power converted by the photovoltaic element and the calculated temperature.

12. The apparatus of claim 11, wherein the apparatus is configured to:
compare the measured electrical power with an expected electrical power of the energy conversion device, and
determine the operating parameter based on the comparison of the measured electrical power with the expected electrical power.

13. The apparatus of claim 12, wherein the apparatus is configured to calculate the expected electrical power from a temperature of the heat source measured by means of a temperature sensor or obtained by means of a characteristic diagram.

14. The apparatus of claim 12, wherein the apparatus is configured to determine the operating parameter within the scope of a diagnosis of the thermoelectric system, during which a functional state of the thermoelectric system is evaluated based on the measured electrical power.

15. The apparatus of claim 14, wherein the evaluation comprises performing at least one of the following diagnoses:
when the measured electrical power is equal to zero, there is no functional capability of the energy conversion device present;
when the currently measured electrical power is equal to zero and at the same time an electrical power measured in a previous driving cycle corresponds to an expected electrical power, an interruption in a circuit is present;
when an actual temperature of the heat source is known and the measured electrical power of the energy conversion device which comprises a plurality of photovoltaic elements is greater than zero and less than the expected electrical power, there is no functional capability present in some of the photovoltaic elements;
when an actual temperature of the heat source is unknown and the measured electrical power of the energy conversion device which comprises a plurality of photovoltaic elements is greater than zero and less than the expected power, either the actual temperature deviates from the expected temperature, or there is no functional capability present in some of the photovoltaic elements;
when the measured electrical power is greater than zero and less than the expected power and the electrical power decreases gradually over, time degradation of the efficiency of the energy conversion device has occurred due to soiling and/or ageing of the photovoltaic elements;
when the measured electrical power drops to zero, there is no interruption present in the circuit;
when the measured electrical power swings to and fro between zero and the expected electrical power, there is a loose contact present; and
when the measured electrical power is greater than the expected electrical power, overheating of the heat source is occurring.

16. The apparatus of claim 11, wherein the apparatus is configured to calculate a current temperature of the heat source based on the measured electrical power.

17. The apparatus of claim 16, wherein the apparatus is configured to:
compare the calculated temperature with an expected temperature of the heat source, and
determine the operating parameter based on the result of this comparison.

18. The apparatus of claim 11, wherein the operating parameter is an efficiency level of the photovoltaic element, and wherein the method comprises:
calculating a temperature of the heat source based on the measured electrical power, and
calculating the efficiency level as a quotient of the calculated temperature and an expected temperature of the heat source measured by a temperature sensor or determined from a characteristic diagram.

19. The apparatus of claim 11, wherein the apparatus is configured to measure the electrical power converted by the photovoltaic element by measuring at least one of the voltage and the current of the energy conversion device.

20. The apparatus of claim 11, wherein the operating parameter is a current temperature of the heat source.

* * * * *